US008772635B2

(12) United States Patent  
Chen et al.

(10) Patent No.: US 8,772,635 B2  
(45) Date of Patent: Jul. 8, 2014

(54) WATERPROOF CASING FOR AN ELECTRONIC DEVICE

(71) Applicant: Sinpro Electronics CO., LTD., Pingtung (TW)

(72) Inventors: Chih-Ming Chen, Pingtung (TW); Chinkuo Hu, Pingtung (TW); Hui-Ling Hsieh, Pingtung (TW); Han-Liang Li, Pingtung (TW)

(73) Assignee: Sinpro Electronics Co., Ltd., Pingtung, Pingtung County (TW)

( * ) Notice: Subject to any disclaimer, the term of this patent is extended or adjusted under 35 U.S.C. 154(b) by 85 days.

(21) Appl. No.: 13/648,110

(22) Filed: Oct. 9, 2012

(65) Prior Publication Data

US 2014/0096993 A1    Apr. 10, 2014

(51) Int. Cl.
*H05K 5/06* (2006.01)
*H05K 5/00* (2006.01)

(52) U.S. Cl.
USPC .......... 174/50; 174/50.52; 174/50.51; 174/66

(58) Field of Classification Search
USPC ......... 174/50, 50.52, 50.51, 522, 66, 67, 259, 174/260; 362/362
See application file for complete search history.

(56) References Cited

U.S. PATENT DOCUMENTS

| | | | | |
|---|---|---|---|---|
| 6,776,650 | B2* | 8/2004 | Cheng et al. | 439/485 |
| 6,882,111 | B2* | 4/2005 | Kan et al. | 315/122 |
| 7,331,689 | B2* | 2/2008 | Chen | 362/240 |
| 8,235,539 | B2* | 8/2012 | Thomas et al. | 362/92 |
| 8,567,986 | B2* | 10/2013 | Szprengiel et al. | 362/217.01 |
| 2004/0185712 | A1* | 9/2004 | Chen | 439/564 |
| 2010/0027266 | A1* | 2/2010 | Tsai et al. | 362/267 |
| 2012/0049561 | A1* | 3/2012 | Young et al. | 296/70 |
| 2012/0162982 | A1* | 6/2012 | Wang et al. | 362/235 |

* cited by examiner

*Primary Examiner* — Robert J Hoffberg  
*Assistant Examiner* — Michael Matey  
(74) *Attorney, Agent, or Firm* — Rabin & Berdo, P.C.

(57) ABSTRACT

A waterproof casing for an electronic device has a body, a cover module and multiple fixers. The body has two connecting assemblies respectively mounted on two side surfaces of the body and each connecting assembly has two wings and a trough defined between the wings and the corresponding side surface of the body. The cover module has a first cover and a second cover respectively mounted on two ends of the body. The fixers are respectively inserted into a corresponding one of the first cover or the second cove and are steadily mounted with the body. The types of the cover module can be changed to fit with an electronic device installed in the body. Therefore, the combination between the body and the cover module is variable, and the waterproof casing has good applicability.

12 Claims, 5 Drawing Sheets

WATERPROOF CASING FOR AN ELECTRONIC DEVICE

BACKGROUND OF THE INVENTION

1. Field of the Invention

The invention relates to a waterproof casing for an electronic device, and more particularly to a waterproof casing that has good applicability.

2. Description of Related Art

An electronic device has a waterproof casing and multiple electronic elements mounted in the waterproof casing. The waterproof casing prevents liquid such as water from permeating into the waterproof casing. Thus, the electronic elements are protected by the waterproof casing and work well. Therefore, waterproof casings of different standards are respectively appropriative for corresponding to electronic devices of different standards. Each appropriative waterproof casing of one standard can only correspond to electronic devices of a particular standard. Thus, the waterproof casing has insufficient applicability.

To overcome the shortcomings, the present invention provides a waterproof casing for an electronic device to obviate the aforementioned problems.

SUMMARY OF THE INVENTION

An objective of the invention is to provide a waterproof casing for an electronic device having good applicability.

The waterproof casing for an electronic device has a body, a cover module and multiple fixers. The body has a chamber, two end surfaces, two side surfaces, a first opening, a second opening and two connecting assemblies. The chamber is defined in the body. The first opening is defined in one of the end surfaces and is in communication with the chamber. The second opening is defined in one of the end surfaces and is opposite to the first opening and is in communication with the chamber. The connecting assemblies are respectively mounted on the side surfaces of the body and each connecting assembly has two wings and a trough. The wings are opposite to each other, and are formed on and protrude from a corresponding one of the side surfaces of the body. The trough is defined between the wings of the connecting assembly and the corresponding side surface of the body.

The cover module has a first cover and a second cover. The first cover is mounted on the first opening of the body and has a first outlet, two protrusions and multiple locking holes. The first outlet is formed through the first cover. The protrusions are respectively formed on two sides of the first cover and are respectively inserted into the troughs of the connecting assemblies. The locking holes are respectively defined in two sides of the first cover and are in communication with the troughs of the connecting assemblies respectively. The second cover is mounted on the second opening of the body and has a second outlet, two protrusions and multiple locking holes. The second outlet is formed through the second cover. The protrusions are respectively formed on two sides of the second cover and are respectively inserted into the troughs of the connecting assemblies. The locking holes are respectively defined in two sides of the second cover and are in communication with the troughs of the connecting assemblies respectively. The fixers are respectively inserted into a corresponding one of the locking holes of the first and second covers and are steadily mounted with the body.

The first cover and the second cover are respectively mounted on two ends of the body. The types of the first cover and the second cover can be changed to fit with an electronic device installed in the body. Therefore, the combination between the body and the cover module is variable. The waterproof casing can be mounted on another electronic device by the troughs of the body. So the waterproof casing has good applicability.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
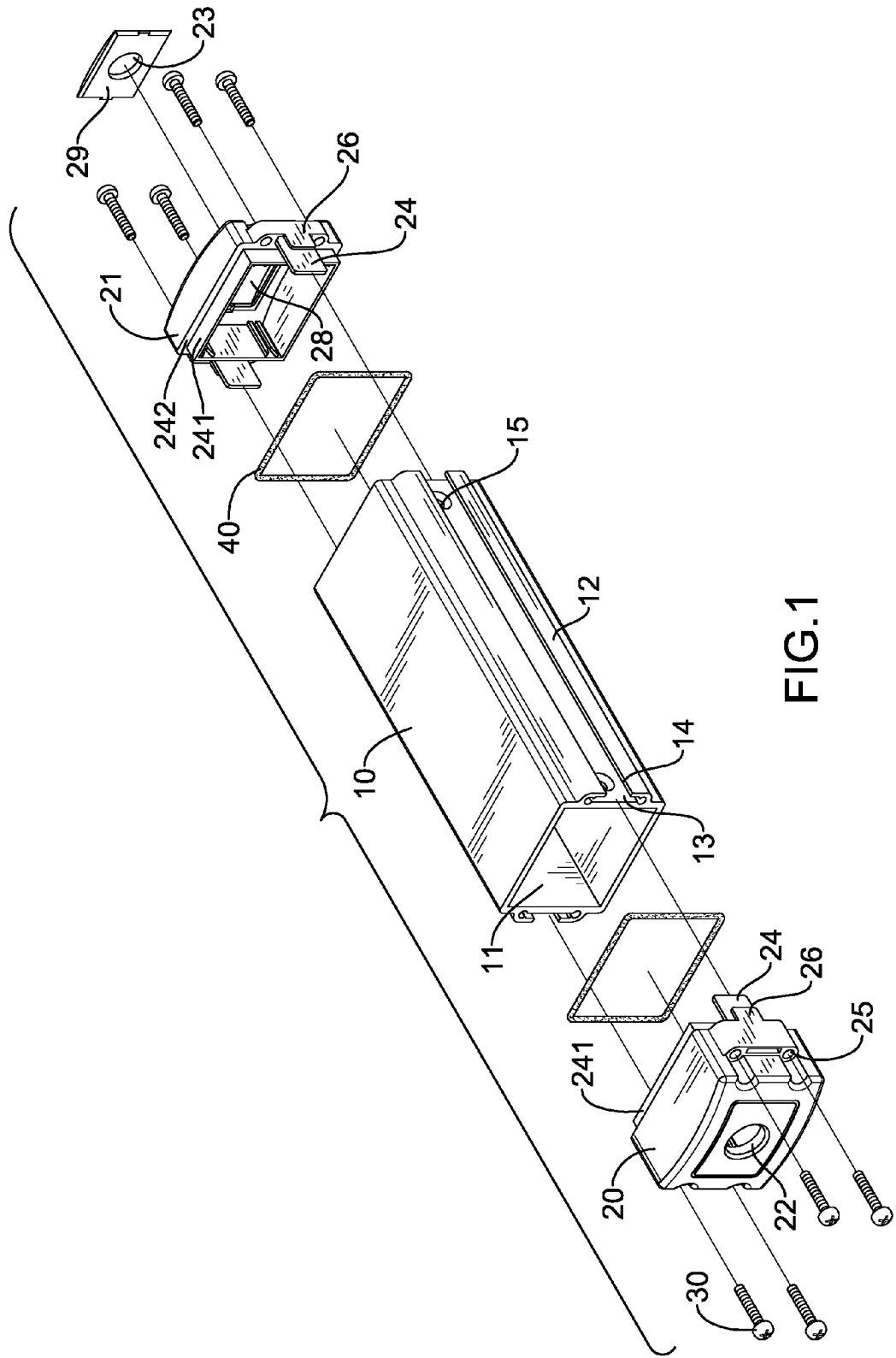
FIG. 1 is an exploded perspective view of a first embodiment of a waterproof casing for an electronic device in accordance with the present invention.
Figure 2:
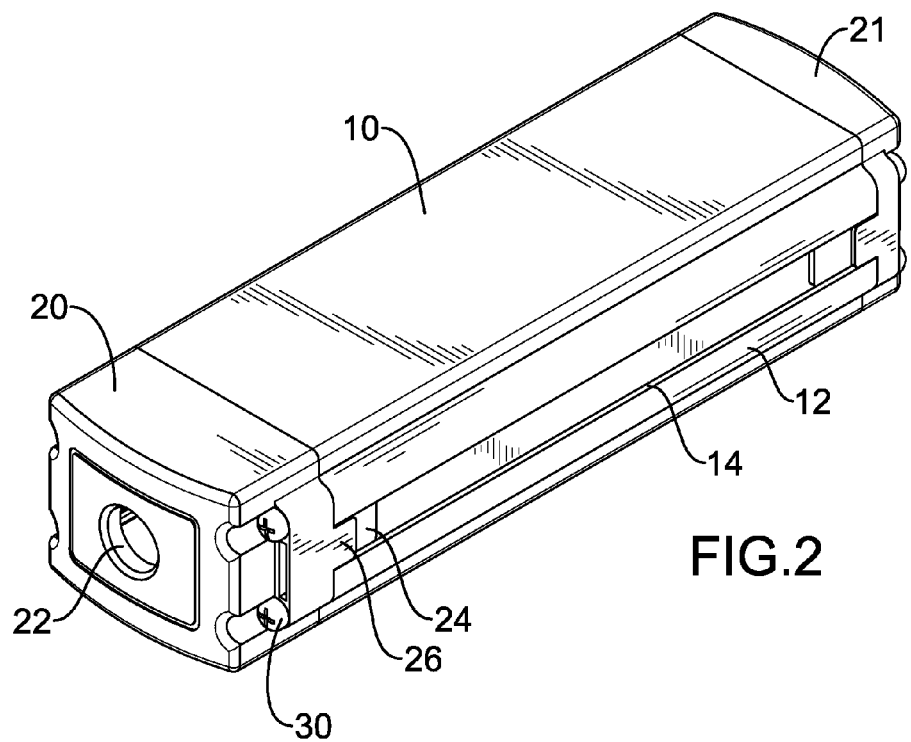
FIG. 2 is a perspective view of the waterproof casing for an electronic device in FIG. 1.

With reference to FIGS. 1 and 2, a waterproof casing for an electronic device in accordance with the present invention comprises a body 10, a cover module and multiple fixers 30.

The body 10 has a chamber 11, two end surfaces, two side surfaces, a first opening, a second opening and two connecting assemblies. The chamber 11 is defined in the body 10. The first opening is defined in one of the end surfaces of the body 10 and is in communication with the chamber 11. The second opening is defined in the other one of the end surfaces of the body 10, is opposite to the first opening and is in communication with the chamber 11. The connecting assemblies are respectively mounted on the side surfaces of the body 10 and each connecting assembly has two wings 12, a trough 13 and a notch 14. The wings 12 of each connecting assembly are opposite to each other and are formed on and protrude from a corresponding one of the side surfaces of the body 10. Each wing 12 has an edge facing to each other. The trough 13 is defined between the wings 12 and the corresponding side surface of the body 10. The notch 14 is formed between the facing edges of the wings 12 and is in communication with the trough 13.

The cover module has a first cover 20 and a second cover 21. The first cover 20 is mounted on the first opening of the body 10 and has a first outlet 22, two protrusions 24 and multiple locking holes 25. The first outlet 22 is formed through the first cover 20 and has an inwall and a bore wall defined in the inwall of the first outlet 22. The protrusions 24 are respectively formed on two sides of the first cover 20 and are respectively inserted into the troughs 13 of the connecting assemblies. The locking holes 25 are respectively defined in two sides of the first cover 20 and are in communication with the troughs 13 of the connecting assemblies respectively. The second cover 21 is mounted on the second opening of the body 10 and has a second outlet 23, two protrusions 24 and multiple locking holes 25. The second outlet 23 is formed through the second cover 21 and has an inwall and a bore wall defined in the inwall of the second outlet 23. The protrusions 24 of the second cover 21 are respectively formed on two sides of the second cover 21 and are respectively inserted into the troughs 13 of the connecting assemblies. The locking holes 25 of the second cover 21 are respectively defined in two sides of the second cover 21 and are in communication with the troughs 13 of the connecting assemblies respectively. Furthermore, the first cover 20 and the second cover 21 both have two panels 26, each panel 26 extends out and is located outside a corresponding one of the protrusions 24 and is inserted into a corresponding one of the notches 14. Each one of the first cover 20 and the second cover 21 has a connecting surface, a wall 241 and an engaging surface 242. The connecting surface faces the body 10. The wall 241 is formed on the connecting surface. The engaging surface 242 is formed on the connecting surface around the wall 241.

The fixers 30 are respectively inserted into a corresponding one of the locking holes 25 of the first and the second covers 20,21 and are steadily mounted with the body 10.

Figure 3:
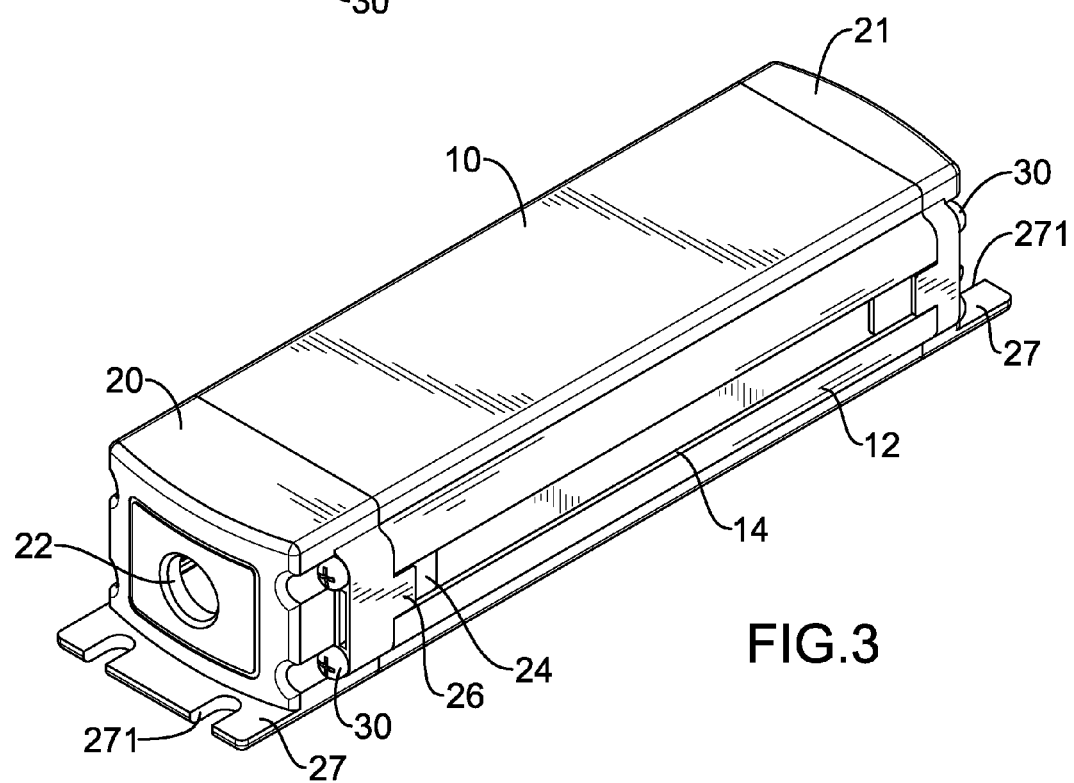
FIG. 3 is a perspective view of a second embodiment of a waterproof casing for an electronic device in accordance with the present invention.
Figure 4:
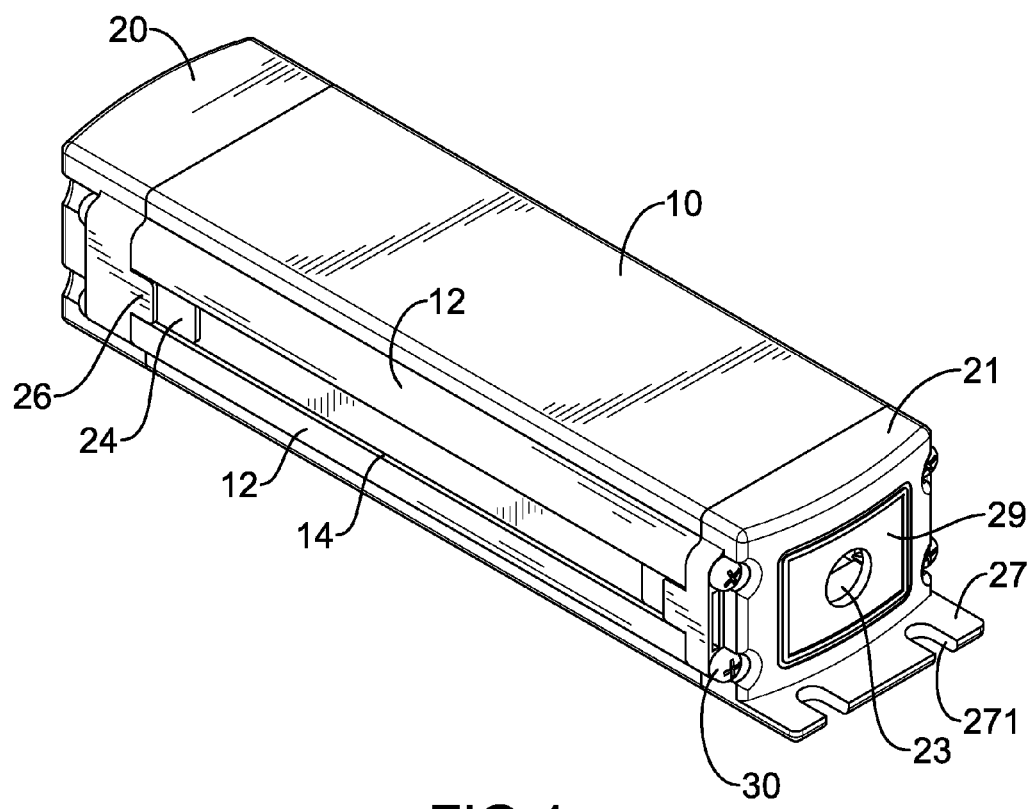
FIG. 4 is a perspective view of a third embodiment of a waterproof casing for an electronic device in accordance with the present invention.

With reference to FIG. 3, the first cover 20 has a bottom edge, a plate 27 and at least one slot 271. The plate 27 of the first cover 20 is formed on the bottom edge of the first cover 20 and protrudes outward from the first cover 20. The at least one slot 271 of the first cover 20 is formed through the plate 27 of the first cover 20. Alternatively, with reference to FIGS. 3 and 4, the second cover 21 has a bottom edge, a plate 27 and at least one slot 271. The plate 27 of the second cover 21 is formed on the bottom edge of the second cover 21 and protrudes outward from the second cover 21. The at least one slot 271 of the second cover 21 is formed through the plate 27 of the second cover 21. Each slot 271 of the first cover 20 and the second cover 21 can provide for a screwed member to be inserted through so as to fix the waterproof casing on a designated object.

Figure 5:
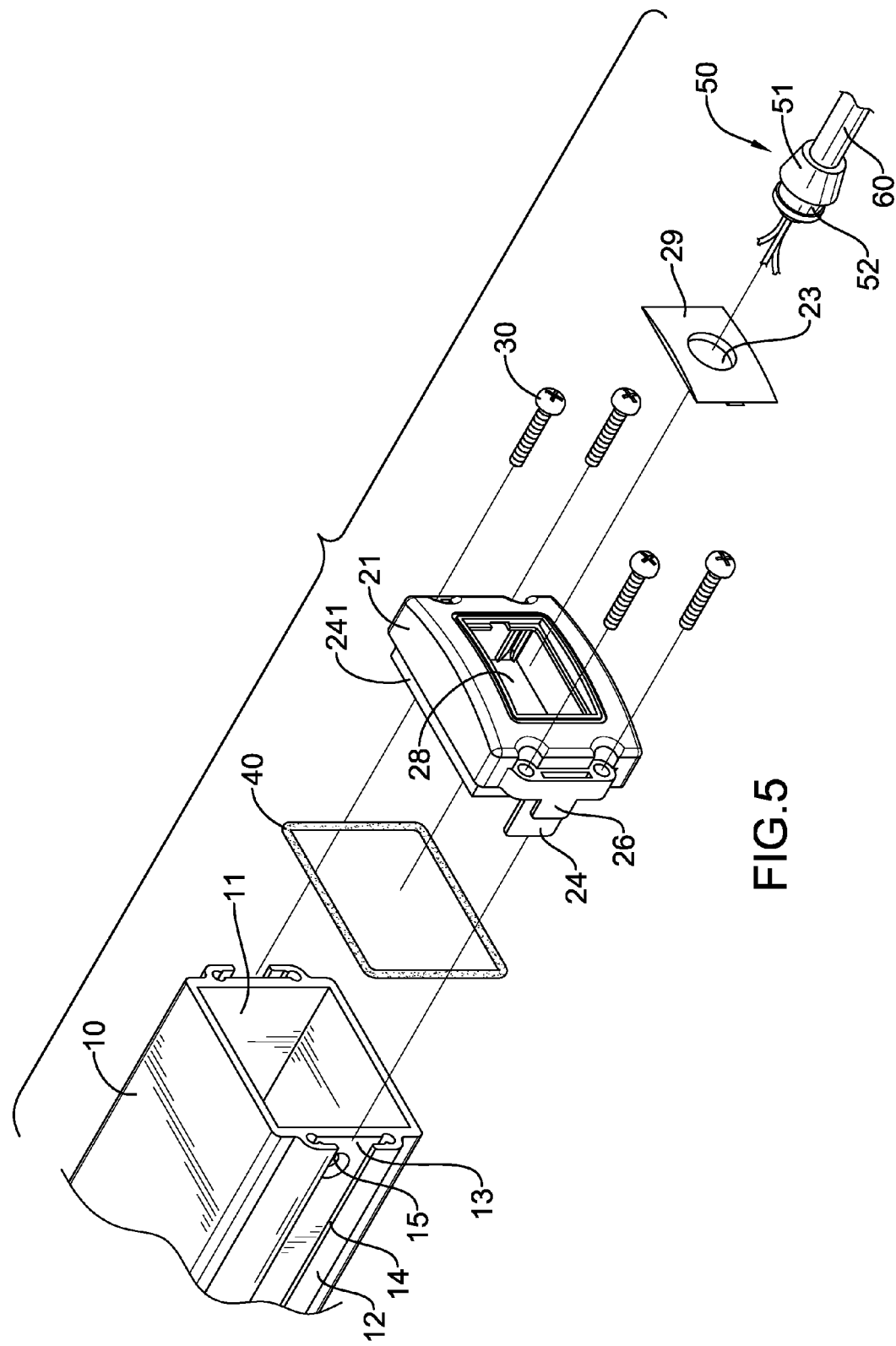
FIG. 5 is an enlarged partial exploded perspective view of the waterproof casing for an electronic device in FIG. 1.

With reference to FIG. 5, the second cover 21 further has an inlet and a cap. The inlet 28 is formed through the second cover 21. The cap 29 is mounted on the second cover 21 and covers the inlet 28 of the second cover 21, and the second outlet 23 is located at the cap 29 of the second cover 21.

The waterproof casing has two sealing rings 40 respectively mounted on the first cover 20 and the second cover 21 and abutting against the body 10. One of the sealing rings 40 abuts against the body 10 and the engaging surface 242 of the first cover 20. The other sealing ring 40 abuts against the body 10 and the engaging surface 242 of the second cover 21. So the sealing rings 40 enhance the sealing effect of the waterproof casing. With reference to FIG. 5, the body 10 has at least one connecting hole 15. The at least one connecting hole 15 is mounted through the body 10 and is in communication with a corresponding one of the notches 14.

Figure 6:
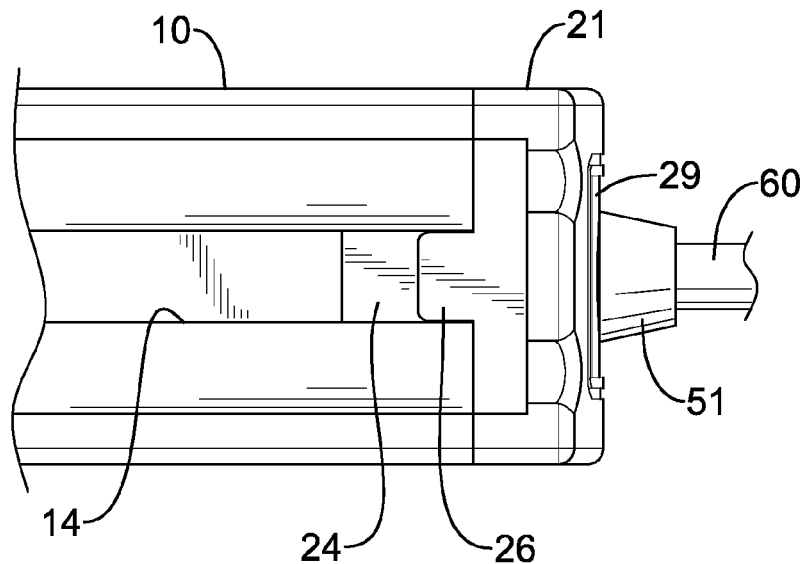
FIG. 6 is an enlarged partial front view of the waterproof casing for an electronic device in FIG. 1.
Figure 7:
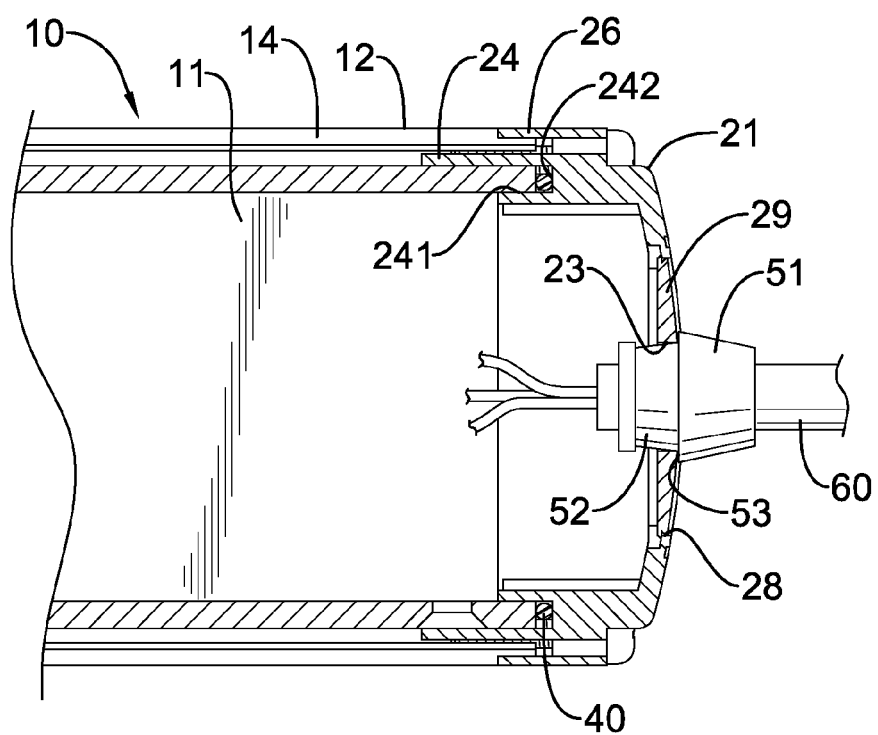
FIG. 7 is a top view in partial section of the waterproof casing for an electronic device in FIG. 1.

The waterproof casing for an electronic device has two connectors 50 respectively mounted into the first outlet 22 of the first cover 20 and the second outlet 23 of the second cover 21. With reference to FIGS. 5 to 7, each connector 50 has an abutting portion 51, a sealing cone 52 and an abutting surface 53. The abutting portion 51 has a side surface. The sealing cone 52 is formed on and protrudes from the side surface of the abutting portion 51. The abutting surface 53 is defined on the side surface of the abutting portion 51 and is adjacent to the sealing cone 52.

An electronic device can be mounted in the chamber 11 of the body 10 of the waterproof casing. The electronic device has at least one wire 60 to extend out of the waterproof casing through a corresponding one of connectors 50. The waterproof casing provides for an electronic device having a T-bar to be slidably inserted into one of the troughs 13 so as to combine the waterproof casing with the electronic device having a T-bar. Each slot 271 of the waterproof casing can provide for a screwed member to be inserted through so as to fix the waterproof casing on a designated object.

While the electronic device is mounted in the waterproof casing, waterproof glue is poured into the chamber 11 of the body 10 via the inlet 28. When the waterproof glue pouring work is done, the cap is mounted on the second cover 21 to cover the inlet 28. Furthermore, the abutting portions 51 and the sealing cones 52 are cone-shaped elements. The sealing cones 52 respectively abut against the bore walls of the first outlet 22 and the second outlet 23. The abutting portions 51 respectively abut against the outer surfaces of the first cover 20, the second cover 21 and the cap 29.

Accordingly, the first cover 20 and the second cover 21 are respectively mounted on two ends of the body 10. Thus, the types of the first cover 20 and the second cover 21 can be changed to fit with the electronic devices installed in the body 10. Therefore, the combination between the body 10 and the cover module is variable. The waterproof casing can be mounted on another electronic device by the troughs 13 of the body 10 and the slots 271 of the cover module. So the waterproof casing has good applicability.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A waterproof casing for an electronic device comprising:
   a body having:
      a chamber defined in the body;
      two end surfaces;
      two side surfaces;
      a first opening defined in one of the end surfaces and in communication with the chamber;
      a second opening defined in another one of the end surfaces and opposite to the first opening and in communication with the chamber; and
      two connecting assemblies respectively mounted on the side surfaces of the body and each connecting assembly having:
         two wings opposite to each other, formed on and protruding from a corresponding one of the side surfaces of the body; and
         a trough defined between the wings of the connecting assembly and the corresponding one of the side surfaces of the body;
   a cover module having:
      a first cover mounted on the first opening of the body and having:
         a first outlet formed through the first cover;
         two first protrusions respectively formed on two sides of the first cover and each of the first protrusions inserted into a respective trough of the connecting assemblies; and
         multiple first locking holes respectively defined in the two sides of the first cover and each of the multiple first locking holes in communication with the respective trough of the connecting assemblies respectively; and
      a second cover mounted on the second opening of the body and having:

a second outlet formed through the second cover;
two second protrusions respectively formed on two sides of the second cover and each of the second protrusions inserted into the respective trough of the connecting assemblies; and
multiple second locking holes respectively defined in the two sides of the second cover and each of the multiple second locking holes in communication with the respective trough of the connecting assemblies respectively; and
a respective one of multiple fixers inserted into a corresponding one of the first locking holes of the first cover or the second locking holes of the second covers and steadily mounted with the body.

2. The waterproof casing as claimed in claim 1, wherein the first cover has:
a first bottom edge;
a first plate formed on the first bottom edge of the first cover and protruding outward from the first cover; and
at least one first slot formed through the first plate of the first cover; and
the second cover has:
a second bottom edge;
a second plate formed on the bottom edge of the second cover and protruding outward from the second cover; and
at least one second slot formed through the second plate of the second cover;
an inlet formed through the second cover; and
a cap mounted on the second cover and covering the inlet of the second cover, and the second outlet being located at the cap.

3. The waterproof casing as claimed in claim 1, wherein the second cover has:
a bottom edge;
a plate formed on the bottom edge of the second cover and protruding outward from the second cover;
at least one slot formed through the plate of the second cover;
an inlet formed through the second cover; and
a cap mounted on the second cover and covering the inlet of the second cover, and the second outlet being located at the cap.

4. The waterproof casing as claimed in claim 1, wherein the waterproof casing has:
a sealing ring mounted on each of the first cover and the second cover, each sealing ring abutting against the body.

5. The waterproof casing as claimed in claim 2, wherein the waterproof casing has:
a sealing ring mounted on each of the first cover and the second cover, each sealing ring abutting against the body.

6. The waterproof casing as claimed in claim 3, wherein the waterproof casing has:
a sealing ring mounted on each of the first cover and the second cover, each sealing ring abutting against the body.

7. The waterproof casing as claimed in claim 1, wherein the waterproof casing has:
a connector mounted into each of the first outlet of the first cover and the second outlet of the second cover, each of the connectors having:
an abutting portion having a side surface;
a sealing cone formed on and protruding from the side surface of the abutting portion; and
an abutting surface defined on the side surface of the abutting portion and adjacent to the sealing cone.

8. The waterproof casing as claimed in claim 2, wherein the waterproof casing has:
a connector mounted into each of the first outlet of the first cover and the second outlet of the second cover, each of the connectors having:
an abutting portion having a side surface;
a sealing cone formed on and protruding from the side surface of the abutting portion; and
an abutting surface defined on the side surface of the abutting portion and adjacent to the sealing cone.

9. The waterproof casing as claimed in claim 3, wherein the waterproof casing has:
a connector mounted into each of the first outlet of the first cover and the second outlet of the second cover, each of the connectors having:
an abutting portion having a side surface;
a sealing cone formed on and protruding from the side surface of the abutting portion; and
an abutting surface defined on the side surface of the abutting portion and adjacent to the sealing cone.

10. The waterproof casing as claimed in claim 4, wherein the waterproof casing has:
a connector mounted into each of the first outlet of the first cover and the second outlet of the second cover, each of the connectors having:
an abutting portion having a side surface;
a sealing cone formed on and protruding from the side surface of the abutting portion; and
an abutting surface defined on the side surface of the abutting portion and adjacent to the sealing cone.

11. The waterproof casing as claimed in claim 5, wherein the waterproof casing has:
a connector mounted into each of the first outlet of the first cover and the second outlet of the second cover, each of the connectors having:
an abutting portion having a side surface;
a sealing cone formed on and protruding from the side surface of the abutting portion; and
an abutting surface defined on the side surface of the abutting portion and adjacent to the sealing cone.

12. The waterproof casing as claimed in claim 6, wherein the waterproof casing has:
a connector mounted into each of the first outlet of the first cover and the second outlet of the second cover, each of the connectors having:
an abutting portion having a side surface;
a sealing cone formed on and protruding from the side surface of the abutting portion; and
an abutting surface defined on the side surface of the abutting portion and adjacent to the sealing cone.

* * * * *